United States Patent [19]

Naito

[11] Patent Number: 5,373,252
[45] Date of Patent: Dec. 13, 1994

[54] CIRCUIT FOR PREVENTING SATURATION OF A TRANSISTOR

[75] Inventor: Hayato Naito, Nagano, Japan
[73] Assignee: Sankyo Seiki Mfg. Co., Ltd., Japan
[21] Appl. No.: 920,469
[22] PCT Filed: Feb. 21, 1991
[86] PCT No.: PCT/JP91/00219
§ 371 Date: Oct. 15, 1992
§ 102(e) Date: Oct. 15, 1992
[87] PCT Pub. No.: WO91/13491
PCT Pub. Date: Sep. 5, 1991

[30] Foreign Application Priority Data

Feb. 21, 1990 [JP] Japan ................... 2-40350

[51] Int. Cl.⁵ .............................................. H03F 3/04
[52] U.S. Cl. ................................. 330/288; 323/315
[58] Field of Search ............. 330/288; 323/315, 316

[56] References Cited

FOREIGN PATENT DOCUMENTS

| | | |
|---|---|---|
| 53-25338 | 3/1978 | Japan . |
| 147608 | 7/1986 | Japan ................... 330/288 |
| 62-57425 | 4/1987 | Japan . |
| 63-87912 | 6/1988 | Japan . |
| 853622 | 8/1981 | U.S.S.R. .................. 323/315 |

*Primary Examiner*—James B. Mullins
*Attorney, Agent, or Firm*—McAulay Fisher Nissen Goldberg & Kiel

[57] ABSTRACT

The present invention concerns a current amplifier which is formed by a transistor, with a view to preventing oversaturation of the transistor. The transistor saturation preventing circuit, according to the invention, includes a second transistor ($Q_2$) which constitutes a current mirror circuit with respect to a first transistor ($Q_1$) forming the current amplifier, a saturation detecting element ($R_1$) connected to the second transistor ($Q_2$) to detect saturation of the first transistor ($Q_1$), and a current feedback element ($D_1$), so as to decrease the base current of the first transistor ($Q_1$).

6 Claims, 3 Drawing Sheets

CIRCUIT FOR PREVENTING SATURATION OF A TRANSISTOR

BACKGROUND OF THE INVENTION a) Field of the Invention

The present invention relates to an amplifier formed by a transistor. More particularly, the invention pertains to a circuit for preventing oversaturation of a transistor which forms a current amplifier.

b) Background Art

Known current amplifiers employing transistors, generally, have circuit constructions such as are shown in FIGS. 9 and 10.

The current amplifier depicted in FIG. 9 uses a PNP type transistor $Q_1$, which has an emitter connected to a power supply Vcc. A load L is connected between a collector of transistor $Q_1$ and ground. A base of the transistor $Q_1$ is connected to an input terminal T, so that a base current $Ib_1$ flows from the base of the transistor $Q_1$ to the input terminal T. Thus, the transistor $Q_1$ supplies the load L with a collector current Ic obtained by multiplying the base current $Ib_1$ by a current amplification factor $\beta$.

The current amplifier shown in FIG. 10 is of a type employing an NPN type transistor $Q_{11}$, which has its emitter grounded, and the load L is connected between a collector of the transistor $Q_{11}$ and the power supply Vcc. A base of the transistor $Q_{11}$ is connected to the input terminal T, from which a base current $Ib_{11}$ flows to the base of the transistor $Q_{11}$. The transistor $Q_{11}$ supplies the load L with the collector current Ic obtained by multiplying the base current $Ib_{11}$ by the current amplification factor $\beta$.

FIG. 11 illustrates relationships among the collector current Ic, the base current Ib and a collector-emitter voltage Vce, which are supplied by the transistor $Q_1$ or $Q_{11}$ forming the current amplifier. In the FIG. 11, the abscissa and ordinate are drawn to represent the collector-emitter voltage Vce and collector current Ic, respectively, and a particular relation is shown between those voltage Vce and current Ic in each of the transistors $Q_1$ and $Q_{11}$, in accordance with the variation of base current Ib flowing in the transistor. Further, as evident from FIG. 11, if the collector emitter voltage Vce is somewhat higher, the collector current Ic is substantially proportional to the base current Ib, but if the collector-emitter voltage Vcc becomes lower, then the same voltage Vcc is proportional to the collector current Ic in the region where a certain amount of the base current Ib flows. At this point, the voltage Vcc is a saturation voltage Vces. In the case where the transistor $Q_1$ or $Q_{11}$ is saturated by supplying a sufficient amount of base current Ib, the collector current Ic, the saturation voltage Vces and ambient temperature Ta bear such the relationships as shown in FIG. 12.

In FIG. 12, there are depicted the relationships between the collector current Ic and the saturation voltage Vces, with ambient temperature Ta varied, wherein the abscissa represents the collector current Ic and the ordinate the saturation voltage Vces. As is apparent from FIG. 12, the saturation voltage Vces is in direct proportion to the collector current Ic and has a positive temperature characteristic, and hence the resistance between the collector and emitter of the transistor in the saturated state is equivalent to a resistor Rces which has a positive temperature coefficient.

In the current amplifiers shown in FIGS. 9 and 10, when the transistors $Q_1$ and $Q_{11}$ are in the saturated state, a further increase of the base current Ib will make the transistors $Q_1$ and $Q_{11}$ oversaturated, rendering unstable their operations of current amplifiers. Also, the current amplifiers will similarly become unstable in operation when the internal impedance of the load L increases abruptly or a voltage is induced in the load L by an external factor.

Therefore, oversaturation of transistors must be prevented. This could be achieved by detecting the moment when the transistor is saturated, through utilization of its saturated voltage and then keeping the base current Ib from leaving or entering the base of the transistor in excess of the base current Ib which left (in the case of the PNP type transistor $Q_1$) or entered (in the case of the NPN type transistor $Q_{11}$) the base of the transistor at the moment of its saturation.

It is not easy, however, to detect the saturated state of the transistor by the saturation voltage Vces. The reason for this is that the saturation voltage Vces is influenced by the collector current Ic and ambient temperature Ta as will be seen from FIG. 12 and undergoes substantial changes according to various conditions.

OBJECT AND SUMMARY OF THE INVENTION

The present invention has for a primary object the provision of a transistor saturation preventing circuit for preventing the saturation of a transistor under any circumstances, which merely requires adding a simple circuit to a current amplifier.

To attain the above object, the transistor saturation preventing circuit according to the present invention is provided with: a current amplifier including a first transistor, a second transistor forming a current mirror circuit with respect to the first transistor, and a saturation detecting means connected to the second transistor to detect a saturation of the first transistor; and a current feedback means which, when the saturation detecting means detects the saturation of the first transistor, becomes electrically conductive, with decrease of voltage down to a level substantially equal to a base-emitter voltage of the second transistor, and feeds back at least one portion of output current of the first transistor to a state preceding the saturation detecting means of the current amplifier, thereby reducing the base current of the first transistor.

Accordingly, in such arrangement, there flows a current proportional to a collector current flowing in the first transistor, and the current flows in the second transistor which forms the current mirror circuit and saturation detecting means. Thus, detecting such current by the saturation detecting means permits for detection of saturation in the first transistor. If the saturation of the first transistor is detected by the saturation detecting means, the feedback means becomes electrically conductive, with decrease of voltage down to a level substantially equal to the base-emitter voltage of the second transistor, thereby feeding back one portion of the output current of first transistor to a circuit preceding the saturation detecting means of the current amplifier, whereby the base current of the first transistor is decreased. It is therefore possible to prevent oversaturation of the first transistor. Furthermore, the present invention ensures prevention of oversaturation of transistors in any case, and hence offers a transistor circuit which is stable regardless of input and load conditions. According to the invention, the circuit to be added therein is relatively simple and economical. In another aspect of the invention, there is employed a current mirror circuit, which serves to keep constant a current ratio between the current flowing in the first transistor and the current flowing in the saturation detecting means. Accordingly, the precision in detecting the saturation is far improved, thus preventing, more positively, the transistor against saturation. Even an excessive operation for such saturation block will not lower the efficiency of the power supply in the circuit.

For better understanding of the present invention, reference is made to the following description and accompanying drawings while the scope of the invention will be pointed out in the appended claims.

DESCRIPTION OF THE PREFERRED EMBODIMENTS AND BEST MODE FOR CARRYING OUT THE INVENTION

Figure 1:
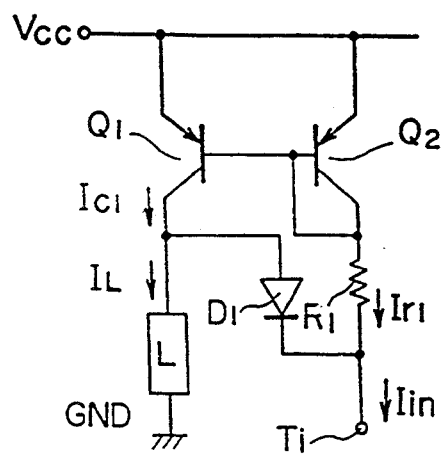
FIG. 1 is a circuit diagram illustrating an embodiment of the transistor saturation preventing circuit according to the present invention.

FIG. 1 illustrates a first embodiment of the transistor saturation preventing circuit according to the present invention.

Figure 9:
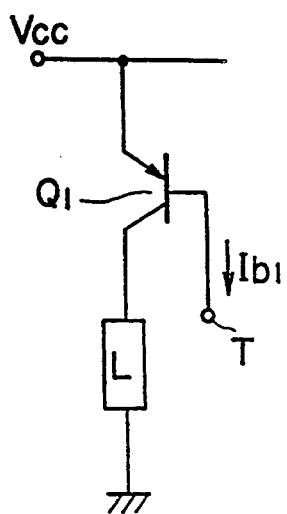
FIG. 9 is a circuit diagram showing a conventional current amplifier.
Figure 10:
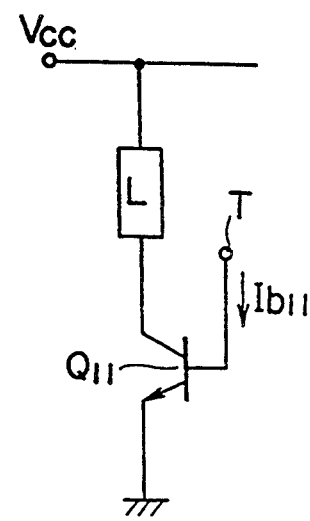
FIG. 10 is a circuit diagram showing another conventional current amplifier.
Figure 11:
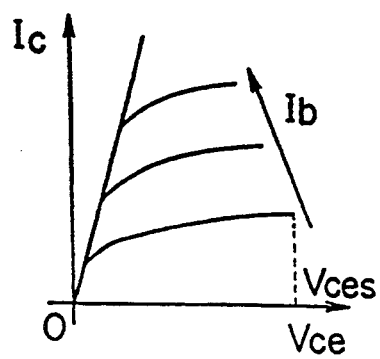
FIG. 11 is a graph showing the relationship between the collector-emitter voltage and collector current of an ordinary transistor.

The illustrated transistor saturation preventing circuit constitutes a current amplifier, wherein a transistor $Q_2$ is added to the conventional circuit shown in FIG. 9 which includes the transistor $Q_1$, forming a current mirror circuit to keep constant the input-output current ratio $Ic_1/Ir_1$. In other words, in such circuit, a current flows in the second transistor $Q_2$ of PNP type in the same way as the collector current Ic flows in the first transistor $Q_1$ of the same PNP type, just as if it was reflected in a mirror, whereupon the PNP-type second transistor $Q_2$ constitutes a current mirror circuit of the PNP-type first transistor $Q_1$. The transistors $Q_1$ and $Q_2$ have their emitters connected to the power supply Vcc and have their bases connected to each other. The transistor $Q_1$ has its base further connected to the collector of the transistor $Q_2$. The load L is connected between the collector of transistor $Q_1$ and the ground GND. The transistor $Q_2$, which forms the foregoing current mirror circuit, is connected at its collector to an input terminal Ti via a resistor $R_1$. The resistor $R_1$ is set to have a minimum value of the collector-emitter voltage Vce of transistor $Q_1$, thus forming a saturation detecting means. The collector of transistor $Q_1$ is further connected to the anode of a diode $D_1$, which has a cathode connected to the circuit on the input terminal Ti side. With such arrangement, when the collector-emitter voltage Vce of the transistor $Q_1$ becomes nearly equal to the value defined by the resistor $R_1$, the diode $D_1$ is energized, thereby feeding back a portion of the collector current $Ic_1$ to the input-terminal-Ti-side circuit disposed at the circuit preceding the resistor $R_1$.

The transistors $Q_1$ and $Q_2$ form a current mirror circuit and also form a current amplifier. The resistor $R_1$ constitutes a saturation detecting means for detecting saturation of the transistor $Q_1$. The diode $D_1$ serves as a current feedback means. Therefore, when the transistor $Q_1$ becomes saturated, the transistor $Q_2$ equivalently acts as a mirror of the transistor $Q_1$, and consequently, a voltage equal to the saturation voltage Vces of the transistor $Q_1$ is induced in the resistor $R_1$, causing the diode $D_1$ to conduct. Such conduction of diode $D_1$ feeds back a portion of the output current $Ic_1$ of the transistor $Q_1$ to the input-terminal-Ti-side circuit at the circuit preceding the resistor $R_1$, so as to decrease the base current Ib which flows out of the transistor $Q_1$. At this point, between both terminals of diode $D_1$, there is developed a voltage drop substantially equal to the base-emitter voltage Vbe of the transistor $Q_2$.

In FIG. 1, an input current via the input terminal Ti is indicated by Iin; a current flowing through the resistor $R_1$ is indicated by $Ir_1$; the collector current of transistor $Q_1$ is indicated by $Ic_1$; and a current flowing through the load L is indicated by $I_L$.

Now, if the input current Iin is gradually increased from zero, a potential at the side of cathode of diode $D_1$, which is initially equal to the supply voltage value of power supply Vcc when the input current Iin is zero, starts to drop toward the ground level by the reason that the base-emitter voltage Vbe of transistor $Q_2$ is induced with such increase of input current Iin and a voltage drops at the resistor $R_1$. At the same time, a potential at the side of anode of the diode $D_1$ (i.e. a potential applied to the load L), which is initially equal to the ground level when the input current Iin is zero, goes up toward the voltage of power supply Vcc in accordance with the increase of load current $I_L$. Thus, the cathode-side potential of diode $D_1$ starts to drop from the supply voltage of power supply Vcc toward the ground level, while the anode-side potential of same $D_1$ is being increased, and subsequently both cathode- and anode-side potentials of diode $D_1$ become equal to each other. Thereafter, if the anode-side potential of diode $D_1$ becomes higher than its cathode-side potential, with a forward voltage applied to the diode $D_1$, then the diode $D_1$ is energized to feed back a portion of the collector current $Ic_1$ of transistor $Q_1$ to the input-terminal-Ti-side portion is added to the input current Iin. By virtue of such fed-back current, the current Ir1 will not increase any longer even if the input current Iin increases further, and circuit, whereby the thus fed-back collector current consequently, the load current $I_L$ does not increase, so that the collector-emitter voltage Vce of transistor $Q_1$ is fixed to a certain value. Letting, now, the collector-emitter voltage of the transistor $Q_1$ at this point of time (when the collector-emitter voltage Vce of the transistor $Q_1$ is fixed to a certain value) be represented by $Vce_1$, and letting the base-emitter voltage of transistor $Q_2$ and the voltage across the diode $D_1$ at that time be represented by $Vbe_2$ and $Vf_1$, respectively, we can express the relation among those voltages by the following equation:

$$Vce_1 = Vbe_2 + R_1 \cdot Ir_1 - Vf_1 \tag{1}$$

The transistors $Q_1$ and $Q_2$ and the diode $D_1$, insofar as they have the same semiconductor structure, are substantially identical in terms of forward voltage drop, including the temperature characteristic thereof, and thus, setting $Vbe_2 = Vf_1$, then the Eq. (1) becomes as follows:

$$Vce_1 = R_1 \cdot Ir_1 \tag{2}$$

Here, if it is desired to operate the transistor $Q_1$ until it verges very close to saturation, let the saturation voltage of transistor $Q_1$ be taken to be $Vces_1$, then it follows from the Eq. (2) that;

$$Vces_1 = R_1 \cdot Ir_1 \tag{3}$$

Figure 12:
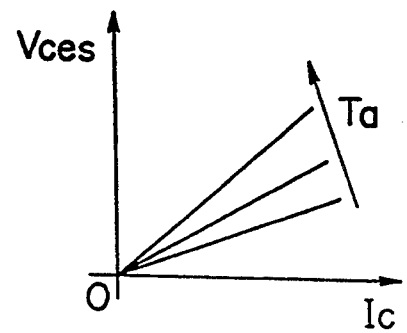
FIG. 12 is a graph showing the temperature dependence of the collector current and the collector-emitter saturation voltage of the ordinary transistor.

Furthermore, the resistance between the collector and emitter of the transistor $Q_1$ in the saturated state is equivalent to a resistor as referred to previously in FIG. 12; hence, designating $Rces_1$ to the equivalent resistance between the collector and emitter of transistor $Q_1$, the following equation can be obtained:

$$Vces_1 = Rces_1 \cdot Ic_1 \tag{4}$$

Substitution of the Eq. (4) into the Eq. (3) gives:

$$R_1 \cdot Ir_1 = Rces_1 \cdot Ic_1$$

$$R_1 = (Ic_1/Ir_1) \cdot Rces_1 \tag{5}$$

The ratio $(Ic_1/Ir_1)$ in the Eq. (5) is the input-output current ratio of the current mirror circuit formed by the transistors $Q_1$ and $Q_2$, and this ratio can be regarded as a fixed constant which is determined by the performance of the transistors $Q_1$, $Q_2$ and values of them set in the circuit. Hence, if the value and temperature coefficient of the equivalent resistance $Rces_1$ are known, the set value of resistor $R_1$ can be determined. That is, the resistance value of resistor $R_1$ as the saturation detecting means corresponds to a product obtained by multiplying the proportional constant $Rces_1$ between the output current $Ic_1$ and saturation voltage $Vces_1$ of first transistor $Q_1$ by the input-output current ratio $(Ic_1/Ir_1)$: current gain) of current mirror circuit composed of the transistors $Q_1$ and $Q_2$. This is expressed by the foregoing Eq. (5).

By setting the value and temperature coefficient of the resistor $R_1$ as described above, it is possible to prevent the transistor $Q_1$ from oversaturation, irrespective of the collector current $Ic_1$ and ambient temperature Ta. Moreover, adjusting the resistor $R_1$ enables desired choice of the saturation degree, including the non-saturated state.

Further, should the collector potential of transistor $Q_1$ go up abruptly owing to a sudden increase in the internal impedance of load L or owing to an abnormal voltage being generated by an external factor, the current flow through diode $D_1$ to thereby immediately cut off the base current of transistor $Q_1$, thus assuring to prevent the oversaturation of transistor $Q_1$.

Figure 2:
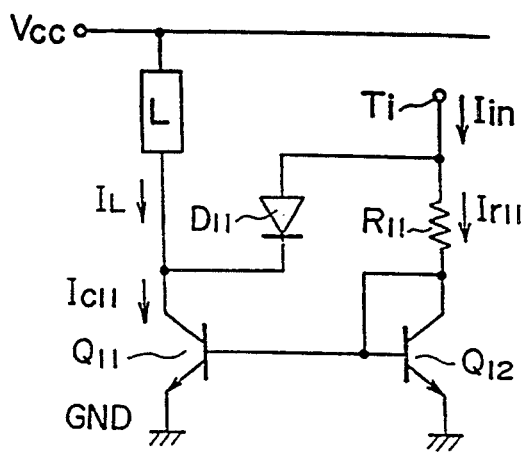
FIG. 2 is a circuit diagram illustrating a second embodiment of the present invention.

FIG. 2 illustrates a second embodiment of the present invention, in which first and second transistors $Q_{11}$ and $Q_{12}$ are both NPN-type transistors. Both emitters of the transistors $Q_{11}$ and $Q_{12}$ are grounded. The transistors $Q_{11}$ and $Q_{12}$ have their bases connected to each other, with the base of the transistor $Q_{11}$ being connected to the collector of the transistor $Q_{12}$. The collector of the transistor $Q_{12}$ is connected to the input terminal Ti via a resistor $R_{11}$. The anode of a diode $D_{11}$ is connected to the input terminal Ti, while the cathode of the same $D_{11}$ is connected to the collector of the transistor $Q_{11}$. The load L is disposed between and connected with the power supply Vcc and the collector of transistor $Q_{11}$.

The second embodiment as constructed above is exactly identical to the embodiment in FIG. 1, except that the transistors $Q_{11}$, $Q_{12}$ and diode $D_{11}$ in the former are opposite in polarity to those in the latter, and that the application of power source voltage in this particular second embodiment differs from that in the first embodiment, which makes reversed the current direction between the two embodiments. The principle of operation and operational effect of the second embodiment are the same as those of the FIG. 1 embodiment, and a specific explanation is deleted thereon. It should be noted, however, that the resistor $R_{11}$ is a saturation detecting means and the diode $D_{11}$ is a current feedback means.

Figure 3:
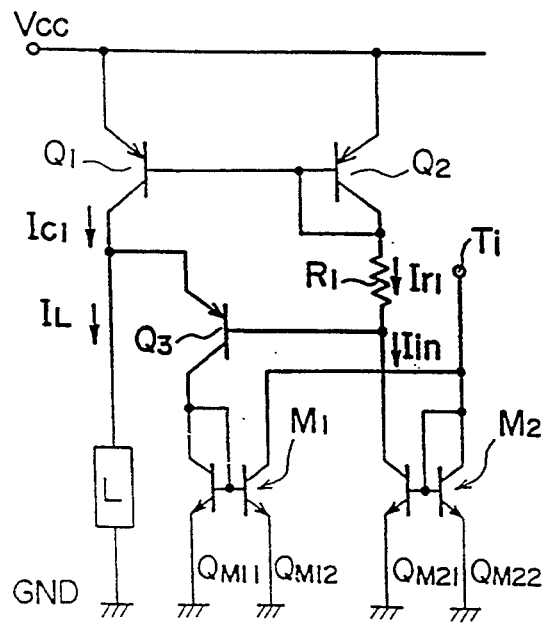
FIG. 3 is a circuit diagram illustrating a third embodiment of the present invention.

FIG. 3 illustrates a third embodiment of the present invention, which employs a PNP-type transistor $Q_3$ and a current mirror circuit $M_1$, instead of using the diode $D_1$ as the feedback means in the FIG. 1 embodiment. In the present embodiment of FIG. 3, the current mirror circuit $M_1$ is disposed between and connected with the collector of transistor $Q_3$ and the ground GND, with a current mirror circuit $M_2$ being connected to the input side (the preceding side) of the resistor $R_1$ which serves as saturation detecting means. Namely, the current mirror circuit $M_1$ is composed of NPN-type transistors $Q_{M11}$ and $Q_{M12}$, which have their emitters grounded. Both bases of the transistors $Q_{M11}$ and $Q_{M12}$ are connected to each other. The base of transistor $Q_{M12}$ is connected to the collector of the transistor $Q_{M11}$. Those transistors are connected to the collector of transistor $Q_3$. The transistor $Q_{M12}$ has its collector connected to the input terminal Ti. The current mirror circuit $M_2$ is comprised of NPN-type transistors $Q_{M21}$ and $Q_{M22}$, which have their emitter grounded. The bases of those transistors $Q_{M21}$ and $Q_{M22}$ are connected to each other. The base of the transistor $Q_{M21}$ is connected to the collector of the transistor $Q_{M22}$. Those transistors are connected to the input terminal Ti. The transistor $Q_{M21}$ is connected at its collector to the resistor $R_1$ and the base of transistor $Q_3$.

Now, let it be assumed that the input current to the current mirror circuit $M_2$ via the input terminal Ti is increased gradually from zero. Then, the collector current of the transistor $Q_{M21}$ in the current mirror circuit $M_2$, which is initially zero when the input current is zero, will go up with increase of that input current to the current mirror circuit $M_2$. Here, since the collector current of the transistor $Q_{M21}$ is the input current Iin, it is seen that the latter Iin increases, which induces the base-emitter voltage $Vbe_2$ of transistor $Q_2$ and also increases the voltage drop across the resistor $R_1$. Consequently, the base potential of the transistor $Q_3$, which is initially equal to the voltage of power supply Vcc when the input current to the current mirror circuit $M_2$ is zero, begins to drop toward the ground level, with increase of that input current to the current mirror circuit $M_2$. At the same time, the emitter potential of the transistor $Q_3$, which is initially equal to the ground level when the input current to the current mirror circuit $M_2$ is zero, rises toward the voltage of power supply Vcc from the ground level with an increase of the load current $I_L$ as the input current to the current mirror circuit $M_2$ increases. Subsequently, the base potential of transistor $Q_3$ becomes equal to the emitter potential of the same. Thereafter, when the base potential of transistor $Q_3$ becomes lower than the emitter potential and the base-emitter voltage Vbe of the transistor $Q_3$ becomes a forward voltage, the transistor $Q_3$ becomes conductive. Upon the transistor $Q_3$ being conductive, a portion of the collector current $Ic_1$ is fed back to the input current of current mirror circuit $M_2$ via the collectors of transistors $Q_{M11}$ and $Q_{M12}$ in the current mirror circuit $M_1$. This decreases the input current to the current mirror circuit $M_2$. In this respect however, any further increase of such input current, which flows from the input terminal Ti to the circuit $M_2$, will keep the forward voltage to be applied to the transistor $Q_3$ and thus will not raise the input current Iin and not raise the load current $I_L$ either. In this way, the collector-emitter voltage Vce of the transistor $Q_1$ is fixed to a certain value. At this point, letting now the collector-emitter voltage of transistor $Q_1$ and the base-emitter voltage of transistor $Q_3$ be represented by $Vce_1$ and $Vbe_3$, respectively, we can express the relation between those two voltages as follows:

$$Vce_1 = Vbe_2 + R_1 \cdot Ir_1 - Vbe_3 \quad (6)$$

Also, in this embodiment, insofar as the transistors $Q_2$ and $Q_3$ have the same semiconductor structure, their respective base-emitter voltages $Vbe_2$ and $Vbe_3$, including their temperature characteristics, are substantially equal to each other (on the understanding that the transistor $Q_1$ is also of the same semiconductor structure as those of the foregoing two transistors). Hence, given the condition: $Vbe_2 = Vbe_3$, we can transform the Eq. (6) to: $Vce_1 = R_1 \cdot Ir_1$, whereupon all the other Eqs. (2) to (5) hold as similar to the embodiment in FIG. 1. Accordingly, oversaturation of the transistor $Q_1$ can be prevented in any cases. Further, the degree of saturation of the transistor $Q_1$ can be chosen arbitrarily by setting the value of the resistor $R_1$.

Figure 4:
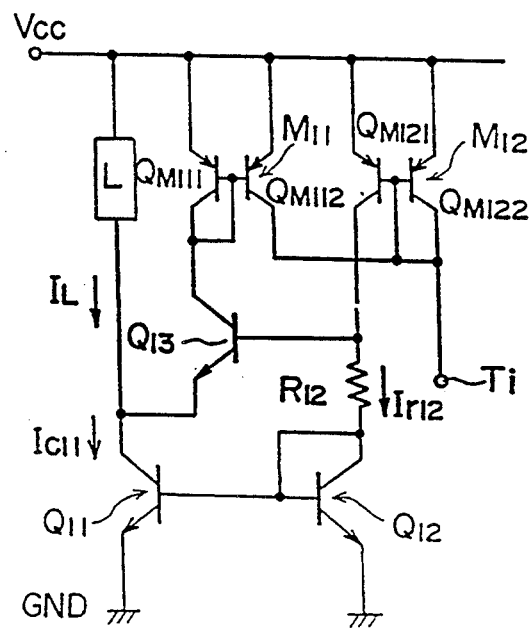
FIG. 4 is a circuit diagram illustrating a fourth embodiment of the present invention.

FIG. 4 illustrates a fourth embodiment of the present invention. This embodiment greatly differs from the FIG. 3 embodiment in that the first and second transistors $Q_{11}$, $Q_{12}$ and the transistor $Q_3$ used as feedback means are all formed by NPN-type transistors and that current mirror circuits $M_{11}$ and $M_{12}$ are both formed by PNP-type transistors. Specifically, the transistors $Q_{11}$ and $Q_{12}$ have their emitters grounded, and have their bases connected to each other, wherein the base of transistor $Q_{11}$ is connected to the collector of transistor $Q_{12}$. The collector of the transistor $Q_{12}$ is connected via a resistor $R_{12}$ to the current mirror circuit $M_{12}$. The load L is disposed between and connected with the power supply Vcc and collector of the transistor $Q_{11}$. The base of transistor $Q_{13}$ is connected to the point where the resistor $R_{12}$ and current mirror circuit $M_{12}$ are connected together, whereas the collector of the transistor $Q_{13}$ is connected to the current mirror circuit $M_{11}$ and the emitter of the same $Q_{13}$ is connected to the collector of transistor $Q_{11}$. The current mirror circuit $M_{11}$ is comprised of PNP-type transistors $Q_{M111}$ and $Q_{M112}$, which have their emitters connected to the power supply Vcc. The bases of the transistors $Q_{M111}$ and $Q_{M112}$ are connected to each other, wherein the base of the transistor $Q_{M112}$ is connected to the collector of the transistor $Q_{M111}$, and those transistors are connected to the collector of the transistor $Q_{13}$. The transistor $Q_{M112}$ has its collector connected to the input terminal Ti. The current mirror circuit $M_{12}$ is comprised of PNP-type transistors $Q_{M121}$ and $Q_{M122}$, the emitters of which are connected to the power supply Vcc. The bases of the transistors $Q_{M121}$ and $Q_{M122}$ are connected to each other, wherein the base of transistor $Q_{M121}$ is connected to the collector of transistor $Q_{M122}$, and hence both transistors are connected to the input terminal Ti. The collector of transistor $Q_{M112}$ is connected to the base of the transistor $Q_{13}$ and to the collector of the transistor $Q_{12}$ via the resistor $R_{12}$.

The present embodiment in FIG. 4 is exactly identical in construction to the FIG. 3 embodiment above, except that the transistors $Q_{11}$, $Q_{12}$, $Q_{13}$ and current mirror circuits $M_{11}$ and $M_{12}$ in the former embodiment are opposite in polarity to those in the latter embodiment, and except that the application of power source voltage in this particular fourth embodiment differs from that in the third embodiment, which makes reversed the current direction between the two embodiments. The principle of operation and operational effect of this embodiment are the same as those of the FIG. 3 embodiment, and hence will not be described in detail. It is noted here that the resistor $R_{12}$ constitutes a saturation detecting means and designations $M_{11}$ and $M_{12}$ denote the current mirror circuits.

Figure 5:
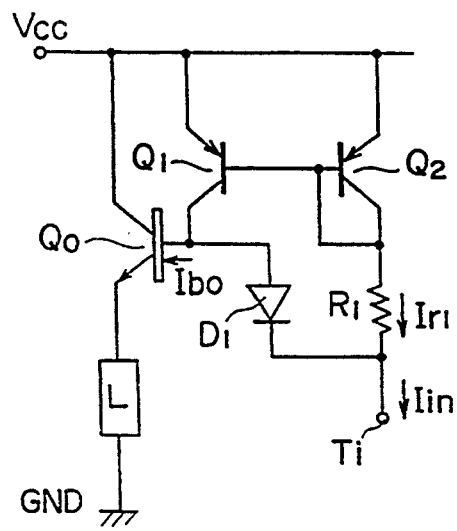
FIG. 5 is a circuit diagram illustrating a fifth embodiment of the present invention.

FIG. 5 illustrates a fifth embodiment of the present invention. This embodiment is constructed, using the FIG. 1 embodiment, such that the load L is connected via a power transistor $Q_0$ to the first embodiment, so as to increase the output current capacity, forming an emitter-follower current amplifier. The transistor $Q_1$ is connected at its collector to the base of the power transistor $Q_0$. The collector of this power transistor $Q_0$ is connected to the power supply Vcc. The load L is disposed between and connected with the emitter of power transistor $Q_0$ and the ground GND.

The principle of operation and operational effect of this fifth embodiment are exactly identical with those of the FIG. 1 embodiment, except that a large current can be applied to the load L by the power transistor $Q_0$.

Figure 6:
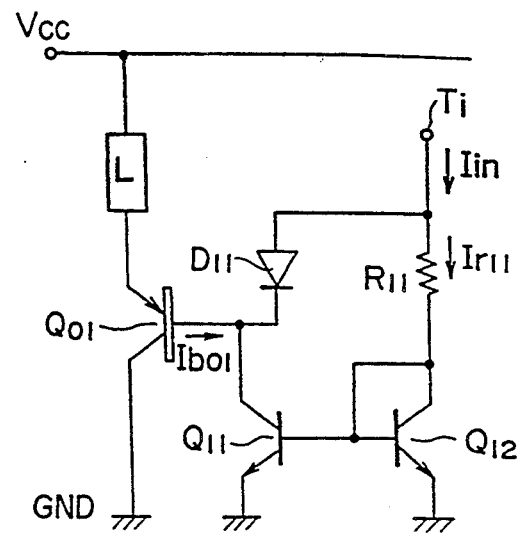
FIG. 6 is a circuit diagram illustrating a sixth embodiment of the present invention.

FIG. 6 illustrates a sixth embodiment of the present invention. This embodiment is constructed, using the second embodiment in FIG. 2, such that the load L is connected to that second embodiment via an PNP-type power transistor $Q_{01}$, which thus forms an emitter-follower current amplifier. specifically, according to this FIG. 6 embodiment, the collector of the transistor $Q_{11}$ is connected to the base of the power transistor $Q_{01}$. The collector of that power transistor $Q_{01}$, is grounded, and the emitter of the same $Q_{01}$ is connected via the load L to the power supply Vcc. The principle of operation and operational effect in the present embodiment are the same as those of the FIG. 5 embodiment, and hence no detailed description thereof will be repeated.

Figure 7:
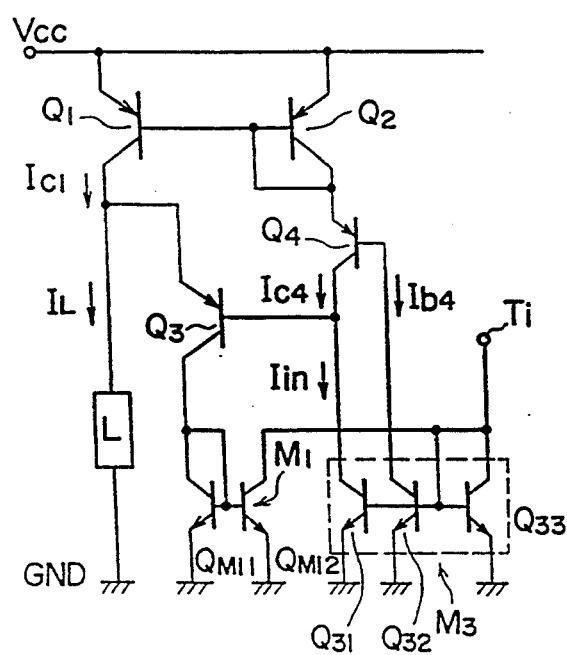
FIG. 7 is a circuit diagram illustrating a seventh embodiment of the present invention.

FIG. 7 illustrates a seventh embodiment of the present invention. In this embodiment, a transistor $Q_4$ is employed as a saturation detecting means, in place of the resistor R1 which is used as the saturation detecting means in the FIG. 3 embodiment, and further there is employed a current mirror circuit $M_3$ comprising three transistors $Q_{M31}$, $Q_{M32}$ and $Q_{M33}$, in place of the current mirror circuit $M_2$ including the two transistors $Q_{M21}$, and $Q_{M22}$ in the FIG. 3 embodiment. The collector of the transistor $Q_{M33}$ in the current mirror circuit $M_3$ is connected to the input terminal Ti of the current circuit of this embodiment. The collector of another transistor $Q_{M32}$ in the current mirror circuit $M_3$ is connected to the base of the transistor $Q_4$. The collector of still another transistor $Q_{M33}$ in the current mirror circuit $M_3$ is connected to the collector of transistor $Q_4$ as well as to the base of transistor $Q_3$.

Now, let it be assumed that the input current to the current mirror circuit $M_3$ from the input terminal Ti is increased gradually from zero. The collector current of the transistor $Q_{M12}$, is still zero, and thus, with regard to the collector current (equal to the current Iin) of the transistor $Q_{M31}$ in the current mirror circuit $M_3$, the initial zero level of the collector current, when the input current thereto is zero, increases with an increase of the collector current (equal to the input current) of the other transistor $Q_{M33}$ in the same circuit $M_3$. At the same time, the collector current (equal to the base current Ib4 of the transistor $Q_4$) of the transistor $Q_{M32}$ is similarly increased in the same circuit $M_3$. Suppose that the current ratio, Ib4/Iin, in that current mirror circuit $M_3$ is set at such a value that renders the transistor $Q_4$ completely saturated. Then, the collector-emitter voltage Vce of transistor $Q_4$ becomes a saturation voltage Vces4 that increases in proportion to a collector current Ic4 of the transistor $Q_4$. When the current Iin increases from zero as mentioned above, the base potential of the transistor $Q_3$ starts to drop toward the ground level from the supply voltage Vcc, owing to the saturation voltage Vces4 and the base-emitter voltage Vbe2 of the transistor $Q_2$. At the same time, the emitter potential of the transistor $Q_3$ rises toward the supply voltage Vcc from the ground level with an increase of the load current $I_L$. Then, when the base potential of transistor $Q_3$ drops lower than the emitter potential thereof, the base-emitter voltage Vbe3 in the same transistor $Q_3$ becomes a forward voltage. Thus, the transistor $Q_3$ conducts, feeding back a portion of the collector current Ic1 to the collector of transistor $Q_{M33}$ of the current mirror circuit $M_3$, via the base of the transistor $Q_{M11}$ and collector of the transistor $Q_{M12}$ of the current mirror circuit $M_1$. With such feedback of current, any further increase of the input current, which flows from the input terminal Ti to the current mirror circuit $M_3$, will not lead to increase of current Iin, as explained in the foregoing embodiment in FIG. 3. Accordingly, the load current $I_L$ will not increase either. In this way, the collector-emitter voltage Vce of the transistor $Q_1$ is fixed to a certain value. The collector-emitter voltage Vce1 of the transistor $Q_1$ at this moment can be obtained by the following equation:

$$Vce_1 = Vbe_2 + V_{ces4} - Vbe_3 \tag{7}$$

Also in this embodiment, insofar as the transistors $Q_2$ and $Q_3$ have the same semiconductor structure, their respective base-emitter voltages Vbe2 and Vbe3, including their temperature characteristics, are substantially equal to each other (on the understanding that the transistor $Q_1$ is also of the same semiconductor structure as those of the foregoing two transistors). Hence, given the condition: Vbe2=Vbe3, we can transform the Eq. (7) above to:

$$Vce_1 = Vces_4 \tag{8}$$

Here, let us give Rces4 to the equivalent resistance between the collector and emitter of transistor $Q_4$ in saturated state. Then, Eq. (8) becomes as follows:

$$Vce_1 = Rces_4 \cdot Ic_4 \tag{9}$$

Similar to the embodiments in FIGS. 1 through 4, the following equations may be established:

$$\begin{aligned} Vces_1 &= Rces_4 \cdot Ic_4 \\ &= Rces_1 \cdot Ic_1 \end{aligned} \tag{10}$$

$$Rces_4 = (Ic_1/Ic_4) \cdot Rces_1 \tag{11}$$

The ratio (Ic1/Ic4) in the Eq. (11) is the input-output current ratio of the current amplifier composed of the transistors $Q_1$ and $Q_2$; namely, a current gain. Therefore, the resistance Rces4 may be multiplied by the current gain (Ic1/Ic4) of the resistance Rces1. If the transistors $Q_1$, $Q_2$, $Q_3$ and $Q_4$ have the same semiconductor structure, there is no difference in temperature coefficient between the resistances Rces1 and Rces4, which eliminate the need for temperature compensation in this embodiment. The equivalent resistance between the collector and emitter of each of the transistors $Q_1$ and $Q_4$ in their saturated state can be controlled by the size of the transistor as well. Thus, this embodiment also insures prevention of oversaturation of the transistor $Q_1$ in any cases. Besides, the degree of saturation of the transistor $Q_1$ may be set selectively, depending on the size of the transistor $Q_4$.

Figure 8:
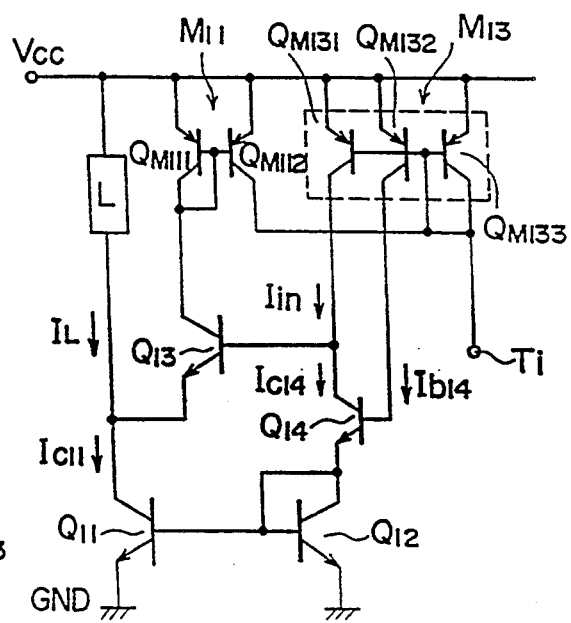
FIG. 8 is a circuit diagram illustrating a eighth embodiment of the present invention.

FIG. 8 illustrates an eighth embodiment of the present invention. This embodiment greatly differs from the one in FIG. 7, in that the first and second transistors $Q_{11}$, $Q_{12}$ and a transistor $Q_{13}$ used as feedback means are all NPN-type transistors, and that there are employed current mirror circuits $M_{11}$ and $M_{13}$ which comprise PNP-type transistors. The transistors $Q_{11}$ and $Q_{12}$ have their emitters grounded. Both bases of those transistors $Q_{11}$, $Q_{12}$ are connected to each other, with the base of transistor $Q_{11}$ being connected to the collector of transistor $Q_{12}$. The collector of the transistor $Q_{12}$ is, in turn, connected via a transistor $Q_{14}$ to the current mirror circuit $M_{13}$. The load L is disposed between and connected with the power supply Vcc and the collector of the transistor $Q_{11}$. The transistor $Q_{13}$ is connected at its base to the point where the collector of transistor $Q_4$ and the current mirror circuit $M_{13}$ are connected together. The collector of transistor $Q_{13}$ is connected to the current mirror circuit $M_{11}$. The emitter of the same $Q_{13}$ is connected to the collector of transistor $Q_{11}$. The current mirror circuit $M_{11}$ is comprised of PNP-type transistors $Q_{M111}$ and $Q_{M112}$. Both emitters of transistors $Q_{M111}$ and $Q_{M112}$ are connected to the power supply Vcc. The bases of those transistors $Q_{M111}$, $Q_{M112}$ are connected to each other, and connected to the collector of transistor $Q_{M111}$; hence, the transistors are connected to the collector of transistor $Q_{13}$. The transistor $Q_{M112}$ has its collector connected to the input terminal Ti. The current mirror circuit $M_{13}$ is comprised of PNP-type transistors $Q_{M13}$, $Q_{M132}$ and $Q_{M133}$, wherein the emitters respectively of the transistors $Q_{M131}$, $Q_{M132}$, $Q_{M133}$ are connected to the power supply Vcc. All bases of the transistors $Q_{M131}$, $Q_{M132}$, $Q_{M133}$ are connected with each other, and connected to the collector of the transistor $M_{133}$; hence the transistors are connected to the input terminal Ti. The transistor $Q_{M131}$ has its collector connected to the base of the transistor $Q_{13}$ and the collector of the transistor $Q_{14}$. The transistor $Q_{M132}$ has its collector connected to the base of the transistor $Q_{14}$. The emitter of transistor $Q_{14}$ is connected to the collector and base of the transistor $Q_{12}$.

The above-described embodiment in FIG. 8 is identical with the one in FIG. 7, except that the transistors $Q_{11}$, $Q_{12}$, $Q_{13}$ and the current mirror circuits $M_{11}$, $M_{13}$ in the former embodiment are opposite in polarity to those in the latter, and that the application of power source voltage in this particular eighth embodiment differs from that in the seventh embodiment, which makes reversed the current direction between the two embodiments. The principle of operation and operational effect of the present embodiment are the same as those of the FIG. 7 embodiment, and no detailed description thereon will be given. It is noted here that the transistor $Q_{14}$ forms a saturation detecting means.

The above-described embodiments are illustrative of preferred embodiments of the present invention, but the invention is not limited specifically thereto and various modifications and variations may be effected without departing from the scope and gist of the invention. For instance, the addition of the power transistor, as in the embodiments of FIGS. 5 and 6, may be done in the other embodiments as well. If the power transistor is added to the transistor $Q_1$ in the embodiments other than the ones shown in FIGS. 5 and 6, it is possible to increase the capacity of current sufficient to be supplied to the load L.

It may also be possible to combine the embodiment(s) in FIGS. 1 and/or 4 with the ones in FIGS. 7 and 8.

According to the embodiments in FIGS. 1, 2, 3, 4, 5 and 6, the degree of saturation of the transistors $Q_1$ and $Q_{11}$ is not sensitive to and not influenced by a change in the set value of the resistor $R_1$, so that the resistor $R_1$, $R_{11}$ need not necessarily be set at a value equal to a calculated value, but may be set close thereto. Accordingly, the value of the resistor $R_1$, $R_{11}$ can be roughly set, with ease. In the case where the circuit of the present invention is fabricated as an integrated circuit (IC), the resistor $R_1$, $R_{11}$ normally has a positive temperature coefficient close to the saturation voltage of the transistor. This saves the necessity of temperature compensation and allows ease in the design of the circuit.

The transistor saturation preventing circuit according to the present invention is applicable to electronic circuits, integrated circuits and similar circuits which amplify and supply current. Moreover, the circuit in the invention operates stably, irrespective of an input condition and a load condition, and therefore may be applied to a measuring circuit which requires intricate connection with other pertinent circuits, a protective circuit for a circuit whose load condition is changeable extremely, and the like.

While the foregoing description and drawings represent the preferred embodiments of the present invention, it will be obvious to those skilled in the art that various changes and modifications may be made therein without departing from the true spirit and scope of the present invention.

I claim:

1. A transistor saturation preventing circuit, comprising a current amplifier which includes a first transistor, a second transistor which forms a current mirror circuit with respect to said first transistor, and a saturation detecting means for detecting a saturation of said first transistor; said saturation detecting means being connected to said second transistor; current feedback means which, when said saturation detecting means detects the saturation of said first transistor, becomes electrically conductive, with decrease of voltage across said current feedback means down to a level substantially equal to a base-emitter voltage of said second transistor, and feeds back at least one portion of output current of said first transistor to a circuit preceding said saturation detecting means of said current amplifier, thereby reducing a base current of said first transistor.

2. The transistor saturation preventing circuit according to claim 1, wherein said saturation detecting means is a resistor.

3. The transistor saturation preventing circuit according to claim 1, wherein said saturation detecting means is a transistor.

4. The transistor saturation preventing circuit according to claim 1, wherein said current feedback means is a diode.

5. The transistor saturation preventing circuit according to claim 1, wherein said current feedback means is a transistor.

6. The transistor saturation preventing circuit according to claim 1, wherein said current feedback means is a current mirror circuit.

* * * * *